United States Patent
Gruner et al.

(10) Patent No.: US 10,321,617 B2
(45) Date of Patent: Jun. 11, 2019

(54) ARRANGEMENT FOR HIGH VOLTAGE COMPONENTS LOCATED IN A MOTOR VEHICLE

(71) Applicant: NEXANS, Paris (FR)

(72) Inventors: Claudius Gruner, Schirmitz (DE); Marina Hoch, Floss (DE)

(73) Assignee: NEXANS, Courbevoie (FR)

( * ) Notice: Subject to any disclaimer, the term of this patent is extended or adjusted under 35 U.S.C. 154(b) by 0 days.

(21) Appl. No.: 15/042,279

(22) Filed: Feb. 12, 2016

(65) Prior Publication Data

US 2016/0295752 A1    Oct. 6, 2016

(30) Foreign Application Priority Data

Feb. 12, 2015    (EP) .................................. 15305210

(51) Int. Cl.
| | | |
|---|---|---|
| *H05K 5/02* | (2006.01) | |
| *H05K 9/00* | (2006.01) | |
| *H01M 2/10* | (2006.01) | |
| *B60R 16/02* | (2006.01) | |

(52) U.S. Cl.
CPC .......... *H05K 9/0049* (2013.01); *B60R 16/02* (2013.01); *H01M 2/1094* (2013.01); *H05K 5/0208* (2013.01); *H05K 5/0247* (2013.01); *H05K 9/0047* (2013.01)

(58) Field of Classification Search
CPC .................................................. H05K 9/0047
See application file for complete search history.

(56) References Cited

U.S. PATENT DOCUMENTS

| | | | | |
|---|---|---|---|---|
| 3,748,538 | A  * | 7/1973 | Shekerjian ............. | H05K 3/284 174/531 |
| 8,835,033 | B2 * | 9/2014 | Choi ....................... | B29C 70/20 180/68.5 |
| 8,919,481 | B2 * | 12/2014 | Matsuda ............. | B60L 11/1877 180/220 |
| 8,953,335 | B2 * | 2/2015 | Abe ........................ | H01L 23/36 165/80.2 |
| 9,496,693 | B2 * | 11/2016 | Maebashi ............ | H05K 5/0052 |
| 2009/0130530 | A1* | 5/2009 | Tanaka ................ | H01M 8/2475 429/515 |

(Continued)

OTHER PUBLICATIONS

Search Report dated 2015.

*Primary Examiner* — Hoa C Nguyen
*Assistant Examiner* — Keith DePew
(74) *Attorney, Agent, or Firm* — Sofer & Haroun, LLP

(57) ABSTRACT

An arrangement for high voltage components located in a motor vehicle, which has a housing for receiving the high voltage components, is completely lockable, conductive and suitable for electromagnetically screening the high voltage components. The housing has openings for electromagnetically compatibly connecting electrical lines to the high voltage components. The housing consists of plastic material which has been rendered electrically conductive by the addition of metallic particles, and has at least on one of its walls at least one support element for the same. The housing is manufactured of the plastic material filled with metallic particles by injection molding, in the shape being adapted to the spatial configurations of the location of mounting in the motor vehicle.

3 Claims, 1 Drawing Sheet

(56) References Cited

U.S. PATENT DOCUMENTS

2012/0107538 A1* 5/2012 Beach ................ H01B 1/22
　　　　　　　　　　　　　　　　　　　　428/35.8
2014/0030582 A1* 1/2014 Haspel ............ B29C 45/0013
　　　　　　　　　　　　　　　　　　　　429/163

* cited by examiner

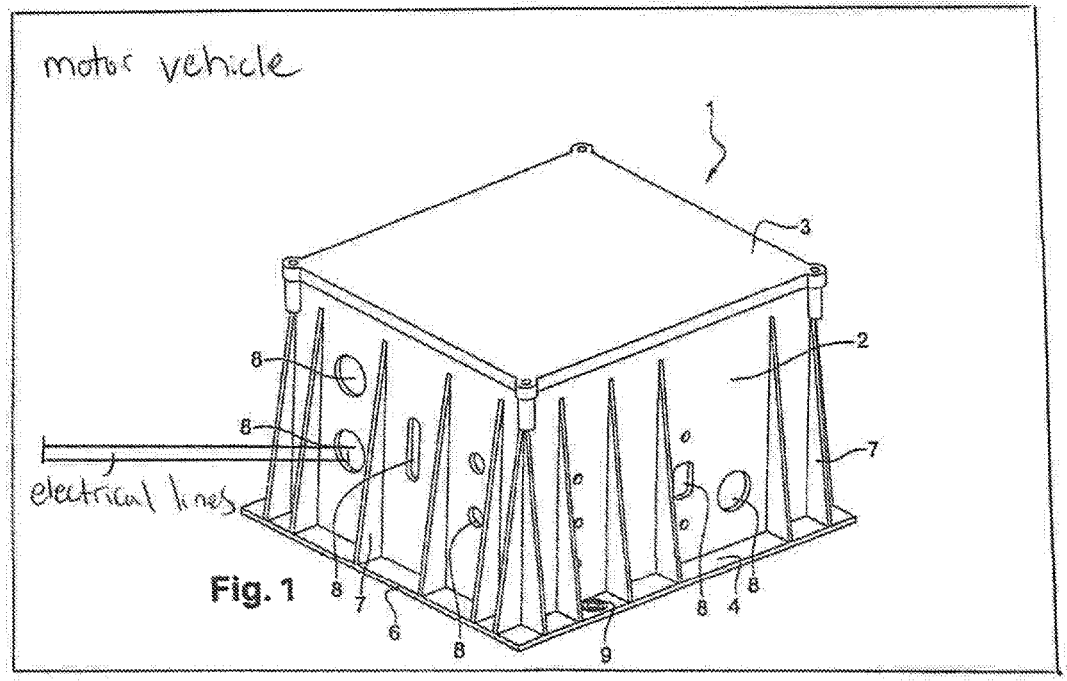
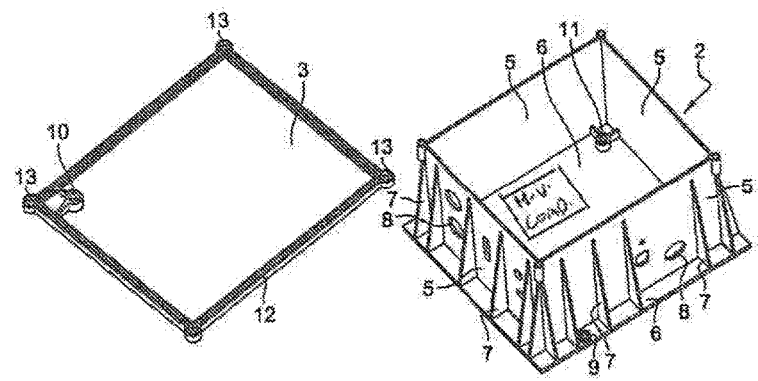

ARRANGEMENT FOR HIGH VOLTAGE COMPONENTS LOCATED IN A MOTOR VEHICLE

RELATED APPLICATION

This application claims the benefit of priority from. European Patent Application No. 15 305 210.5, filed on Feb. 12, 2015, the entirety of which is incorporated by reference.

BACKGROUND

Field of the Invention

The invention relates to an arrangement for high voltage components located in a motor vehicle, which has a housing for receiving the high voltage components, which is completely lockable, is conductive, and is suitable for electromagnetically screening the high voltage components arranged in the housing, and has openings for electromagnetically connecting the electrical lines to the high voltage components.

Description of Related Art

In electric and hybrid motor vehicles there are a plurality of electrical and electronic components to be used for operating the motor vehicle and other tasks. The operating energy is supplied by traction batteries which produce very high operating voltages, typically to more than one hundred volts. In electric motor vehicles the operating voltage can be, for example, up to 600 v.

In order to protect people against contact, with these, high voltages, the electric and hybrid motor vehicles must have especially strict safety requirements. In order to ensure against contact, certain protective devices are necessary in these motor vehicles. In electric motor vehicles this, as well as others, is an insulation monitor. The insulation monitor protects all the electrical components in the motor vehicle against damage or malfunctions. They are composed of high voltage components which protect all high voltage lines and high voltage systems. Depending on the magnitude of the measured malfunction, the motor vehicle driver will be notified by a control light or the entire motor vehicle will automatically shut off in order to prevent any electricity from flowing.

The necessary components for the insulation monitor are high voltage components. These components are in a so-called monitoring box. The monitoring box is composed of a closed electrical conductive housing, in which the high voltage components are screened. The housing has in its wall a plurality of bores which allows the connection of screened electric lines to the high voltage components, without interrupting the screening. The screening of the housing and the lines are electrically connected in the area of the bores, for example, through claw type connectors. The connectability of the housing allows the energy flow between each line screen and the housing as well as the electric connection of the housing to the motor vehicle mass, the chassis. The equalization between the housing and the chassis ensures the contact protection of the monitoring box. The contact protection as well as the tightness against water (short term immersion) and dust are combined through the protective class IP67, which must correspond to the monitoring box. The monitoring box must further meet certain mechanical and temperature requirements which result from use in a motor vehicle (vibrations, heating, etc.).

Such known housings are composed of metal, for example, aluminum. The monitoring box is, for example, box shaped, has a cover that is water and dust proof and can be locked. Such aluminum boxes, for example, have dimensions of approximately 160 mm×200 mm×220 mm, with a wall thickness of approximately 5 mm and a weight of approximately 4 kg. The bores for the line connections are made after the manufacture of the housing, as needed. The known housing is thus very heavy, is difficult to manufacture and is expensive. Usually the box shaped form of the housing is predetermined so that its placement in an appropriate location in the motor vehicle must be prepared.

DE 11 2006 002 637 T5 discloses a housing for receiving a fuel cell stack that is composed of a resin and electromagnetic wave dampening material. The electromagnetic wave dampening material can be a conductive material and therefore, for example, an aluminum filler or a graphite filler, scale type structure or a thin aluminum plate. The housing has openings which serve for ventilation.

Objects and Summary

The invention is based on the object of developing an arrangement with a housing for high voltage components which meets the above mentioned electrical and mechanical properties, has a low weight and is without special manufacturing requirements to produce it in the desired shape.

In accordance with the invention, this object is met in
that the housing is composed of plastic material which through the addition of metallic particles is rendered electrically conductive,
that the housing has at least on one of its walls at least one support element for the same, and
that the housing is manufactured in the shape being adapted to the spatial configurations of the location of mounting in the motor vehicle.

The use of plastic material filled with metallic particles for manufacturing a housing for high voltage components has several advantages. Objects of plastic can be manufactured by injection molding. This method allows the fully automatic, mass produced, precisely repeated manufacture of objects of plastic having any chosen shape. In this connection, the manufacturing process includes only a few method steps because openings and additional elements can already be fabricated during the injection molding process. This also applies in the same manner to plastic filled with metallic particles. The material to be processed can be available as pellets in which the metallic particles are mixed with the plastic. The housing can therefore already be configured during its manufacture, so that its shape can be optimally adapted to the spatial configurations of the location of mounting in the motor vehicle. The shape can deviate from the known cuboid form.

The placement location does not have to have a predetermined shape prepared for the installation of the housing, as it is in the case for a conventional metal housing. The housing meets all of the requirements of a housing for high voltage components: Load bearing capacity, temperature resistant, protection against contact as well as dust and watertight according to protection class IP67, contacting incapability, damping of screening, conductivity. Furthermore, the housing has a substantially lower weight in comparison to a metal housing which, for example, is composed of aluminum. The material and manufacturing costs are also comparatively lower in comparison to those of a metal housing.

A polymer filled with metallic particles has the advantage that it is can be processed exactly in the same way as pure plastic by means of injection molding. For example, this cannot intrinsically be done with conductive synthetic materials. Metallic particles are used as a conductive addition because with these, in contrast to non-metallic particles (for example, carbon), conductive or screen damping values can be achieved.

BRIEF DESCRIPTION OF THE DRAWINGS

An embodiment of the invention is illustrated in the drawings.

They show:

FIG. 1 a perspective view of the housing in accordance with an embodiment.

FIG. 2 the housing according to FIG. 1 in the open state.

In the drawings the same numbers correspond to the same technical features.

DETAILED DESCRIPTION

In FIG. 1 a housing 1 is shown for high voltage components. The housing 1 consists essentially of a box shaped lower part 2 and a cover 3. In FIG. 2 the cover 3 and the lower part 2 are illustrated separately for clarity's sake. The illustrated example serves to illustrate the invention. As already mentioned, the housing 1 may advantageously have any chosen configuration.

The box shaped lower part 2 consists of a bottom 4 and four walls 5 which are arranged in accordance with a right angle ground plan on the bottom 4. Of course the ground plan and the walls can have any configuration. The surface area of the bottom 4 is larger than the enclosed surface area of the walls 5. The all-around protruding edge 6 of the bottom 4 can, for example, be used to secure the housing 1 within the motor vehicle and/or for obtaining a conductive connection with the chassis in order to connect the housing 1 with the chassis. The cover 3 has a soft seal 12 which follows a circumferential groove and thus, the housing 1 can be tightly closed against water and dust.

According to the illustrated embodiment the walls 5 have support elements 7. They serve to mechanically stabilize the walls 5. In the illustrated example the support elements 7 have an advantageous triangular shape. Through the presence of the support elements 7, a very small wall thickness can be achieved without impairing the mechanical stability of the housing 1. Because of this, the wall thickness may only be a few millimeters, for example in the range from 1 mm to 4 mm. Through the smaller wall thickness, the total weight of the housing 1 can advantageously be further reduced.

As illustrated in FIGS. 1 and 2, the walls 5 have different types of openings 8. The openings 8 serve the purpose of connecting the high voltage components contained in the housing 1 or to guide the lines into the housing. The electrical lines, as well as the housing 1 itself, are screened electromagnetically. The connection between the housing 1 and the screen for the lines must be configured so that the total screening should not be interrupted. For example, injected molded metal parts or injection molded flanged bushings can be placed or inserted in the openings 8 into which the lines are screwed so that the screened lines are in contact with the metallic parts. Also, cable shoes which are equipped with self-cutting screws or threads fastened on the housing 1, is possible. Furthermore, the screen for the lines can be soldered or glued on to the housing 1.

Each of the ends of the connecting cable are connected to a mounted threaded box 10 or 11 each in the lower part 2 and the cover 3 for effecting contact between the two parts 2 and 3 of the housing 1. In addition, the housing 1 has in its bottom 4 at least a further collared sleeve or threaded box 9 to fasten the housing 1 on the motor vehicle part and for contact with the chassis, for example, by means of a screw.

A thermoplastic material is used for the housing 1. Suitable thermoplastic material is for example, polyamide, polypropylene or acrylnitril-butudene-styrene (ABS). The metallic particles are, for example, composed of high grade steel, copper or tin. These metals have a relatively high conductivity. They are present in the form of fibers.

The invention claimed is:

1. Arrangement for high voltage components present in a motor vehicle, comprising:
   a housing for receiving the high voltage components,
   wherein said arrangement is completely lockable, and
   wherein said arrangement is electrically conductive and suitable for electromagnetically screening the high voltage components arranged in the housing, and
   wherein said arrangement has a box shape lower part having a bottom and four walls arranged on a bottom,
   wherein the surface area of the bottom is larger than the enclosed surface of the walls, a protending edge of the bottom being used for obtaining a conductive connection with the chassis of the motor vehicle,
   wherein the housing has in the bottom at least a further collared sleeve or threaded box to fasten the housing on the motor vehicle part and for contact with the chassis by means of screw,
   wherein the walls of said arrangement have openings of different types for electromagnetically compatibly fastening electrical lines to the high voltage components,
   wherein the housing is composed of plastic material, which, through the addition of metallic particles of any one of steel, copper, tin or a combination thereof, is rendered electrically conductive,
   wherein the housing has on its walls at least one support elements which mechanically stabilize the same, said support elements having a triangular shape, and
   wherein the housing is manufactured with the plastic material filled with metallic particles through injection molding into a shape having any desired configuration.

2. Arrangement according to claim 1, wherein the wall thickness of the housing is between 1 mm and 4 mm.

3. Arrangement according to claim 1, wherein the housing is composed of a thermoplastic material that is filled with metallic particles.

* * * * *